United States Patent
Wu et al.

(10) Patent No.: US 6,580,145 B2
(45) Date of Patent: Jun. 17, 2003

(54) LOW PROGRAMMING VOLTAGE ANTI-FUSE STRUCTURE

(75) Inventors: Shien-Yang Wu, Hsin Chu (TW); Ta-Lee Yu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/761,294

(22) Filed: Jan. 16, 2001

(65) Prior Publication Data

US 2002/0094611 A1 Jul. 18, 2002

(51) Int. Cl.[7] .......................... H01L 29/00; H01L 21/479
(52) U.S. Cl. ........................................ 257/530; 438/467
(58) Field of Search ............................ 257/530; 438/467

(56) References Cited

U.S. PATENT DOCUMENTS

| | | | | |
|---|---|---|---|---|
| 5,110,754 A | * | 5/1992 | Lowrey et al. | 257/371 |
| 5,341,009 A | * | 8/1994 | Young et al. | 257/296 |
| 5,798,649 A | * | 8/1998 | Smayling et al. | 324/551 |
| 5,946,575 A | | 8/1999 | Yamaoka et al. | 438/276 |
| 6,096,580 A | | 8/2000 | Iyer et al. | 438/132 |
| 6,294,820 B1 | * | 9/2001 | Lucas et al. | 257/410 |
| 6,306,689 B1 | * | 10/2001 | Kim et al. | 257/529 |
| 2002/0004309 A | * | 6/1999 | Collins et al. | 438/719 |

OTHER PUBLICATIONS

Candelier et al., "One Time Programmable Drift Antifuse Cell Reliability", IEEE 38th Annual International Reliability Physics Symposium, San Jose, CA 2000, pp. 169–173.

* cited by examiner

Primary Examiner—Olik Chaudhuri
Assistant Examiner—William M. Brewster
(74) Attorney, Agent, or Firm—Tung & Associates

(57) ABSTRACT

Within both an anti-fuse structure and a method for operating the anti-fuse structure there is employed a semiconductor substrate having a first region adjoining a second region, where there is formed a metal oxide semiconductor field effect transistor within and upon the first region of the semiconductor substrate and a metal oxide semiconductor capacitor within the upon the second region of the semiconductor substrate. Further, within the anti-fuse structure: (1) a gate dielectric layer within the metal oxide semiconductor field effect transistor is thicker than a capacitive dielectric layer within the metal oxide semiconductor capacitor; and (2) the metal oxide semiconductor capacitor is formed employing as a first capacitor plate a doped well within the semiconductor substrate of equivalent polarity with and overlapping with a source/drain region within the metal oxide semiconductor field effect transistor. The anti-fuse structure has a comparatively low programming voltage which does not electrically overstress adjacent microelectronic devices.

7 Claims, 1 Drawing Sheet

LOW PROGRAMMING VOLTAGE ANTI-FUSE STRUCTURE

BACKGROUND OF THE INVENTION

1. Field of the Invention

The present invention relates generally to anti-fuse devices and anti-fuse structures, as employed when fabricating microelectronic fabrications. More particularly, the present invention relates to anti-fuse devices and anti-fuse structures with comparatively low programming voltage, as employed when fabricating microelectronic fabrications.

2. Description of the Related Art

Microelectronic fabrications are formed from microelectronic substrates over which are formed patterned microelectronic conductor layers that are separated by microelectronic dielectric layers.

In addition to conventional microelectronic devices and microelectronic structures that are employed when fabricating microelectronic fabrications, including but not limited to conventional microelectronic transistor devices and conventional microelectronic transistor structures, conventional microelectronic resistor devices and conventional microelectronic resistor structures, conventional microelectronic capacitor devices and conventional microelectronic capacitor structures and conventional microelectronic diode devices and conventional microelectronic diode structures that are employed when fabricating microelectronic fabrications, microelectronic anti-fuse devices and microelectronic anti-fuse structures are also of interest for use when fabricating microelectronic fabrications.

Microelectronic anti-fuse devices and microelectronic anti-fuse structures are of interest for use when fabricating microelectronic fabrications insofar as microelectronic anti-fuse devices and microelectronic anti-fuse structures often provide cost effective microelectronic devices and microelectronic structures that may be employed for functions within microelectronic fabrications including but not limited to redundant circuit programming functions within microelectronic fabrications, as well as microelectronic fabrication product identification functions within microelectronic fabrications.

While microelectronic anti-fuse devices and microelectronic anti-fuse structures are thus of interest for use when fabricating microelectronic fabrications and are often invaluable for use when economically fabricating various types of microelectronic fabrications, microelectronic anti-fuse devices and microelectronic anti-fuse structures are nonetheless not entirely without problems in the art of microelectronic fabrication. In that regard, microelectronic anti-fuse devices and microelectronic anti-fuse structures when fabricated within microelectronic fabrications are often difficult to electrically actuate to provide electrically conductive fused microelectronic anti-fuse devices and electrically conductive fused microelectronic anti-fuse structures without in turn electrically over-stressing adjacent microelectronic devices and adjacent microelectronic structures within the microelectronic fabrications within which are fabricated the microelectronic anti-fuse devices and the microelectronic anti-fuse structures.

It is thus desirable in the art of microelectronic fabrication to provide methods and materials for fabricating within microelectronic fabrications microelectronic anti-fuse devices and microelectronic anti-fuse structures which upon electrical actuation minimally electrically stress adjacent microelectronic devices and adjacent microelectronic structures within the microelectronic fabrications within which are fabricated the microelectronic anti-fuse devices and the microelectronic antifuse structures.

It is towards the foregoing object that the present invention is directed.

Various microelectronic fabrication devices and microelectronic fabrication structures having desirable properties, including but not limited to microelectronic anti-fuse devices and microelectronic anti-fuse structures having desirable properties, have been disclosed in the art of microelectronic fabrication.

For example, Yamaoka et al., in U.S. Pat. No. 5,946,575, discloses a microelectronic anti-fuse structure and a method for fabricating the microelectronic anti-fuse structure, where there is independently maintained an integrity of electrical properties of a pair of adjoining microelectronic devices fabricated within the microelectronic anti-fuse structure. To realize the foregoing object the microelectronic anti-fuse structure comprises a pair of adjoining metal oxide semiconductor field effect transistor (MOSFET) devices formed within and upon a single silicon substrate layer, where a higher breakdown voltage metal oxide semiconductor field effect transistor (MOSFET) device within the pair of metal oxide semiconductor field effect transistor (MOSFET) devices employs a thicker gate dielectric layer and a lower semiconductor substrate channel doping concentration in comparison with a lower breakdown voltage metal oxide semiconductor field effect transistor (MOSFET) device within the pair of metal oxide semiconductor field effect transistor (MOSFET) devices.

In addition, Iyer et al., in U.S. Pat. No. 6,096,580, discloses a method for fabricating, with a comparatively low programming voltage, a microelectronic anti-fuse device that may be employed within a microelectronic anti-fuse structure that in turn may be employed within a microelectronic fabrication. To realize the foregoing object, the method employs ion implanting into: (1) a gate dielectric layer within a metal oxide semiconductor field effect transistor (MOSFET) microelectronic anti-fuse device; or (2) a capacitive dielectric layer within a metal oxide semiconductor (MOS) capacitor microelectronic anti-fuse device, a dose of a comparatively heavy implanting ion, such as a comparatively heavy indium implanting ion, such as to provide the metal oxide semiconductor field effect transistor (MOSFET) microelectronic anti-fuse device or the metal oxide semiconductor (MOS) capacitor microelectronic anti-fuse device with the comparatively low programming voltage.

Finally, Candelier et al., in "One Time Programmable Drift Antifuse Cell Reliability," IEEE 38th Annual International Reliability Physics Symposium, San Jose, Calif., 2000, pp 169–73, discloses a microelectronic anti-fuse structure that may be employed within a microelectronic fabrication, wherein the microelectronic anti-fuse structure may be fabricated employing methods as are fully compatible with complementary metal oxide semiconductor (CMOS) fabrication methods otherwise employed for fabricating the microelectronic fabrication. To realize the foregoing object, the microelectronic anti-fuse structure comprises a metal oxide semiconductor (MOS) capacitor microelectronic anti-fuse device fabricated electrically in series with a drift N-metal oxide semiconductor field effect transistor (MOSFET) device.

Desirable in the art of microelectronic fabrication are additional microelectronic anti-fuse devices and microelectronic anti-fuse structures which upon electrical actuation minimally electrically stress adjacent microelectronic devices and adjacent microelectronic structures within the microelectronic fabrications within which are fabricated the microelectronic anti-fuse devices and the microelectronic anti-fuse structures.

It is towards the foregoing object that the present invention is directed.

SUMMARY OF THE INVENTION

A first object of the present invention is to provide for use when fabricating a microelectronic fabrication an anti-fuse structure and a method for operating the anti-fuse structure.

A second object of the present invention is to provide the anti-fuse structure and the method for operating the anti-fuse structure in accord with the first object of the present invention, where upon electrical actuation of the anti-fuse structure there is minimally electrically stressed adjacent microelectronic devices and adjacent microelectronic structures within the microelectronic fabrication within which is fabricated the microelectronic anti-fuse structure.

A third object of the present invention is to provide an anti-fuse structure and a method for fabricating the anti-fuse structure in accord with the first object of the present invention and the second object of the present invention, where the method is readily commercially implemented.

In accord with the objects of the present invention, there is provided by the present invention an anti-fuse structure for use when fabricating a microelectronic fabrication and a method for operating the anti-fuse structure for use when fabricating the microelectronic fabrication.

The anti-fuse structure of the present invention comprises in a first instance a semiconductor substrate having a first region adjoining a second region. In addition, the anti-fuse structure of the present invention also comprises a metal oxide semiconductor field effect transistor (MOSFET) device formed within and upon the first region of the semiconductor substrate and a metal oxide semiconductor (MOS) capacitor device formed within and upon the second region of the semiconductor substrate. Finally, within the anti-fuse structure of the present invention: (1) a gate dielectric layer within the metal oxide semiconductor field effect transistor (MOS) device is thicker than a capacitive dielectric layer within the metal oxide semiconductor (MOS) capacitor device; and (2) the metal oxide semiconductor (MOS) capacitor device employs as a first capacitor plate a doped well within the semiconductor substrate of equivalent polarity with and overlapping with a source/drain region within the metal oxide semiconductor field effect transistor (MOSFET) device.

The anti-fuse structure of the present invention contemplates at least one method for forming the anti-fuse structure of the present invention, as well as a method for operating the anti-fuse structure of the present invention.

The present invention provides, for use when fabricating a microelectronic fabrication, an anti-fuse structure and a method for operating the anti-fuse structure, where upon electrical actuation of the anti-fuse structure there is minimally electrically stressed adjacent microelectronic devices and adjacent microelectronic structures within the microelectronic fabrication within which is fabricated the anti-fuse structure. The anti-fuse structure of the present invention realizes the foregoing object by employing within the anti-fuse structure as formed within and upon a semiconductor substrate: (1) a metal oxide semiconductor field effect transistor (MOSFET) device; and (2) a metal oxide semiconductor (MOS) capacitor device, where: (1) a gate dielectric layer within the metal oxide semiconductor field effect transistor (MOSFET) device is thicker than a capacitive dielectric layer within the metal oxide semiconductor (MOS) capacitor device; and (2) the metal oxide semiconductor (MOS) capacitor device employs as a first capacitor plate a doped well within the semiconductor substrate of equivalent polarity with and overlapping with a source/drain region within the metal oxide semiconductor field effect transistor (MOSFET) device.

The method of the present invention is readily commercially implemented. As will be illustrated in greater detail within the Description of the Preferred Embodiment, as set forth below, an anti-fuse structure fabricated and operated in accord with the present invention may be fabricated and operated employing methods and materials as are otherwise generally known in the art of microelectronic fabrication, but employed at least in part with a specific ordering to provide an anti-fuse structure with specific structural characteristics and operational characteristics in accord with the present invention. Since it is thus a specific ordering of methods and materials that provides at least in part the present invention, rather than the existence of specific methods and materials that provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides, for use when fabricating a microelectronic fabrication, an anti-fuse structure and a method for operating the anti-fuse structure, where upon electrical actuation of the anti-fuse structure there is minimally electrically stressed adjacent microelectronic devices and adjacent microelectronic structures within the microelectronic fabrication within which is fabricated the anti-fuse structure. The anti-fuse structure of the present invention realizes the foregoing object by employing within the anti-fuse structure as formed within and upon a semiconductor substrate: (1) a metal oxide semiconductor field effect transistor (MOSFET) device; and (2) a metal oxide semiconductor (MOS) capacitor device, where: (1) a gate dielectric layer within the metal oxide semiconductor field effect transistor (MOSFET) device is thicker than a capacitive dielectric layer within the metal oxide semiconductor (MOS) capacitor device; and (2) the metal oxide semiconductor (MOS) capacitor device employs as a first capacitor plate a doped well within the semiconductor substrate of equivalent polarity with and overlapping with a source/drain region within the metal oxide semiconductor field effect transistor (MOSFET) device.

Although the preferred embodiment of the present invention illustrates the present invention within the context of an anti-fuse structure formed within and upon a semiconductor substrate employed within a semiconductor integrated circuit microelectronic fabrication, through use of appropriate thin film deposition methods that may be employed to provide a semiconductor thin film material which may be employed as a "semiconductor substrate" layer, an anti-fuse structure in accord with the present invention may be fabricated and operated within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
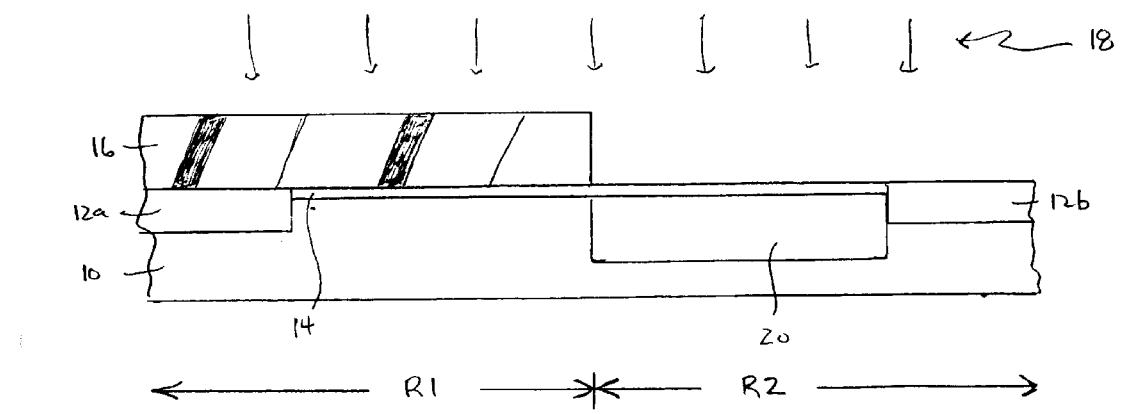
FIG. 1 and FIG. 2 show a pair of schematic cross-sectional diagrams illustrating the results of progressive stages in fabrication of an anti-fuse structure in accord with a preferred embodiment of the present invention.
Figure 2:
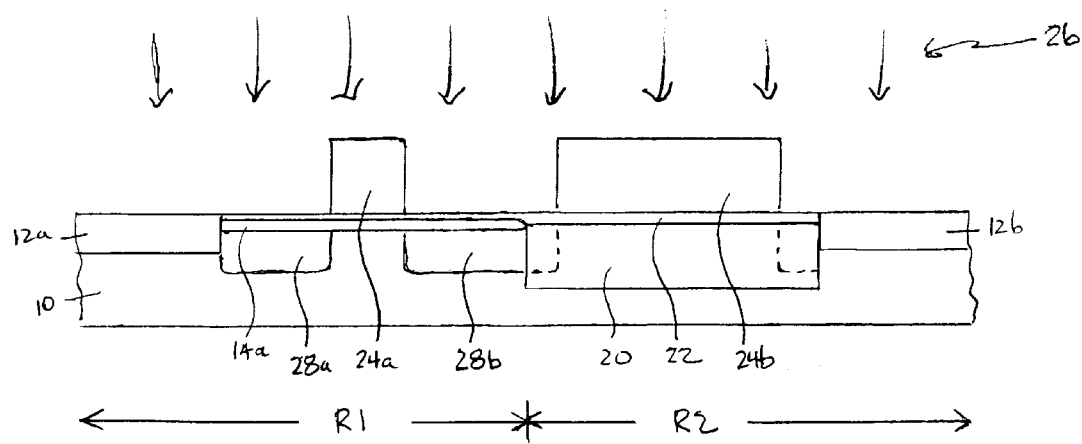

Referring now to FIG. 1 and FIG. 2, there is shown a pair of schematic cross-sectional diagrams illustrating the results of progressive stages in fabricating, in accord with a preferred embodiment of the present invention, an anti-fuse structure within a semiconductor integrated circuit microelectronic fabrication.

Shown in FIG. 1 is a schematic cross-sectional diagram of the semiconductor integrated circuit microelectronic fabrication at an early stage of fabrication therein of the anti-fuse structure in accord with the preferred embodiment of the present invention.

Shown in FIG. 1, in a first instance, is a semiconductor substrate 10 having formed therein a pair of isolation regions 12a and 12b that define an active region of the semiconductor substrate 10.

Within the preferred embodiment of the present with respect to the semiconductor substrate 10, and although it is known in the art of semiconductor integrated circuit microelectronic fabrication that semiconductor substrates are available with either dopant polarity, several dopant concentrations and various crystallographic orientations, for the preferred embodiment of the present invention, the semiconductor substrate 10 is typically and preferably a (100) silicon semiconductor substrate having an P-dopant concentration of from about $10^{14}$ to about $10^{17}$ dopant atoms per cubic centimeter, although an anti-fuse structure in accord with the present invention may also be fabricated employing other semiconductor substrates of either polarity, and in particular employing other silicon semiconductor substrates of –polarity.

Similarly, although it is also known in the art of semiconductor integrated circuit microelectronic fabrication that isolation regions may be formed within and upon semiconductor substrates to define active regions of semiconductor substrates while employing methods including but not limited to isolation region thermal growth methods and isolation region deposition/patterning methods, for the preferred embodiment of the present invention, each of the isolation regions 12a and 12b which defines the active region of the semiconductor substrate 10 is typically and preferably formed as a shallow trench isolation region formed at least in part employing an isolation region deposition/patterning method, and preferably a chemical mechanical polish (CMP) planarizing isolation region patterning method, to form the pair of isolation regions 12a and 12b at least in part of a silicon oxide shallow trench isolation dielectric material.

Shown also within the schematic cross-sectional diagram of FIG. 1, and formed upon and covering the active region of the semiconductor substrate 10 as defined by the pair of isolation regions 12a and 12b, is a blanket first gate dielectric layer 14.

Although it is known in the art of semiconductor integrated circuit microelectronic fabrication that gate dielectric layers may be formed employing methods including but not limited to gate dielectric layer thermal growth methods and gate dielectric deposition/patterning methods, for the preferred embodiment of the present invention, the blanket first gate dielectric layer 14 formed upon and covering the active region of the semiconductor substrate 10 is typically and preferably formed employing a gate dielectric layer thermal growth method at a temperature of from about 500 to about 1200 degrees centigrade, where the blanket first gate dielectric layer 14 is formed of a silicon oxide gate dielectric material formed to a thickness of from about 20 to about 200 angstroms.

There is also shown within the schematic cross-sectional diagram of FIG. 1 a patterned photoresist layer 16 covering a first region R1 of the semiconductor substrate 10 including a first portion of the active region of the semiconductor substrate 10.

Within the preferred embodiment of the present invention, the patterned photoresist layer 16 may be formed of photoresist materials as are generally conventional in the art of microelectronic fabrication, such photoresist materials being selected from the general groups of photoresist materials including but not limited to positive photoresist materials and negative photoresist materials. Typically and preferably, the patterned photoresist layer 16 is formed covering the first region R1 of the semiconductor substrate 10 including the first portion of the active region of the semiconductor substrate 10.

Finally, there is shown within the schematic cross-sectional diagram of FIG. 1 a dose of first dopant ions 18 that is employed for forming within a second portion of the active region of the semiconductor substrate within a second region R2 of the semiconductor substrate 10 which adjoins the first region R1 of the semiconductor substrate, a doped well 20.

Within the preferred embodiment of the present invention, the dose of first dopant ions 18, and thus also the doped well 20, is of a polarity opposite the polarity of the semiconductor substrate 10. Thus, within the preferred embodiment of the present invention when the semiconductor substrate 10 is typically and preferably provided as an P-silicon semiconductor substrate, the dose of first dopant ions 18 and the doped well 20 are typically and preferably formed employing an N dopant, typically and preferably provided at an ion implantation dose of from about $10^{12}$ to about $10^{14}$ dopant ions per square centimeter and an ion implantation energy of from about 50 to about 300 kev to provide within the semiconductor substrate the doped well 20 having a dopant concentration of from about $5\times10^{16}$ to about $5\times10^{18}$ dopant atoms per cubic centimeter.

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but where, in a first instance, the blanket first gate dielectric layer 14 has been patterned to form a patterned first gate dielectric layer 14a which covers only the first portion of the active region of the semiconductor substrate 10 within the first region R1 of the semiconductor substrate 10 and does not cover the second portion of the active region of the semiconductor substrate 10 within the second region R2 of the semiconductor substrate 10.

Within the preferred embodiment of the present invention, the blanket first gate dielectric layer 14 may be patterned to form the patterned first gate dielectric layer 14a while employing methods as are conventional in the art of microelectronic fabrication, where such methods will typically and preferably include etch methods, such as but not limited to wet chemical etch methods and dry plasma etch methods, as may be employed for etching the dielectric material from which is formed the blanket first gate dielectric layer 14 to in turn form therefrom the patterned first gate dielectric layer 14a while further in turn employing the patterned photoresist layer 16 as an etch mask layer.

Shown also within the schematic cross-sectional diagram of FIG. 2, after having first patterned the blanket first gate dielectric layer 14 to form the patterned first gate dielectric layer 14a while employing the patterned photoresist layer 16 as an etch mask layer and then having stripped from the patterned first gate dielectric layer 14a the patterned photoresist layer 16 while employing photoresist stripping methods as are conventional in the art of microelectronic fabrication, is a blanket contiguous second gate dielectric layer and capacitive dielectric layer 22 formed over the active region of the semiconductor substrate 10 and in particular upon the patterned first gate dielectric layer 14a within the first region R1 of the semiconductor substrate 10 and upon the second portion of the active region of the semiconductor substrate 10 within the second region R2 of the semiconductor substrate 10.

Within the preferred embodiment of the present invention, the blanket contiguous second gate dielectric layer and capacitive dielectric layer 22 may be formed employing methods and materials as are analogous or equivalent to the methods and materials employed for forming the blanket first gate dielectric layer 14 as illustrated within the semiconductor integrated circuit microelectronic fabrication whose schematic cross-sectional diagram is illustrated in FIG. 1. Similarly, although the blanket contiguous second gate dielectric layer and capacitive dielectric layer 22 may thus be formed employing methods including but not limited to thermal growth methods and deposition/patterning methods, for the preferred embodiment of the present invention, the blanket contiguous second gate dielectric layer and capacitive dielectric layer 22 is typically and preferably formed employing a thermal growth method employing a temperature of from about 500 to about 1200 degrees centigrade to form the blanket contiguous second gate dielectric layer and capacitive dielectric layer 22 of a silicon oxide dielectric material analogous or equivalent to the silicon oxide dielectric material from which is formed the blanket first gate dielectric layer 14 and the patterned first gate dielectric layer 14a.

Within the preferred embodiment of the present invention, typically and preferably, the blanket contiguous second gate dielectric layer and capacitive dielectric layer 22 is formed to a thickness of from about 5 to about 50 angstroms, thus the blanket contiguous second gate dielectric layer and capacitive dielectric layer 22 and the patterned first gate dielectric layer 14a in an aggregate provide a composite gate dielectric layer thickness of from about 30 to about 300 angstroms (more preferably from about 30 to about 70 angstroms) upon the first portion of the active region of the semiconductor substrate 10 within the first region R1 of the semiconductor substrate 10 while the blanket contiguous second gate dielectric layer and capacitive dielectric layer 22 provides a dielectric layer thickness of from about 5 to about 50 angstroms (more preferably from about 10 to about 30 angstroms) upon the second portion of the active region of the semiconductor substrate 10 within the second region R2 of the semiconductor substrate 10.

Shown also within the schematic cross-sectional diagram of FIG. 2 is a gate electrode 24a formed upon the blanket contiguous second gate dielectric layer and capacitive dielectric layer 22 within the first region R1 of the semiconductor substrate 10 and a second capacitor plate 24b formed upon the blanket contiguous second gate dielectric layer and capacitive dielectric layer 22 within the second region R2 of the semiconductor substrate 10.

Within the preferred embodiment of the present invention, the gate electrode 24a and the second capacitor plate 24b may be formed employing methods and materials as are conventional in the art of microelectronic fabrication, such methods typically and preferably including blanket deposition and photolithographic patterning methods that may be employed for forming the gate electrode 24a and the second capacitor plate 24b of a conductor material selected from the group including but not limited to metal, metal alloy, doped polysilicon (having a dopant concentration (of either polarity) of greater than about $10^{19}$ dopant atoms per cubic centimeter) and polycide (doped polysilicon/metal silicide) conductor materials, although either of the last two conductor materials (of either polarity but preferably of polarity equivalent to the doped well 20) are preferred within the preferred embodiment of the present invention. Typically and preferably, each of the gate electrode 24a and the second capacitor plate 24b is formed to a thickness of from about 1000 to about 3000 angstroms, where the gate electrode 24a is typically and preferably further formed of a linewidth from about 0.2 to about 1 microns and the second capacitor plate 24b is typically and preferably further formed of a linewidth from about 0.1 to about 0.3 microns, still further where each of the gate electrode 24a and the second capacitor plate 24b is of a linewidth which is contained within their respective portions of the active region of the semiconductor substrate 10 within either the first region R1 of the semiconductor substrate 10 or the second region R2 of the semiconductor substrate 10.

Finally, there is also shown within the schematic cross-sectional diagram of FIG. 2 a dose of second dopant ions 26 that is employed primarily for forming within the first portion of the active region of the semiconductor substrate 10 within the first region R1 of the semiconductor substrate 10 a pair of source/drain regions 28a and 28b, while employing the gate electrode 24a and the second capacitor plate 24b as an ion implantation mask. As is illustrated within the schematic cross-sectional diagram of FIG. 2, additional portions of the second portion of the active regions of the semiconductor substrate 10 within the second region R2 of the semiconductor substrate 10 are also incidentally ion implanted with the dose of second dopant ions 26.

Within the preferred embodiment of the present invention, the dose of second dopant ions 26 is of polarity equivalent to the polarity of the dose of first dopant ions 18 as illustrated within the schematic cross-sectional diagram of FIG. 1. Similarly, as is also illustrated within the schematic cross-sectional diagram of FIG. 2, the dose of second dopant ions 26 is implanted into the active region of the semiconductor substrate 10 as illustrated within the schematic cross-sectional diagram of FIG. 2 in a fashion such as to provide an overlap of the source/drain region 28b with the doped well 20. Finally, the dose of second implanting ions 26 is provided at an ion implantation dose of from about $10^{14}$ to about $5 \times 10^{15}$ dopant ions per square centimeter and an ion implantation energy of from about 5 to about 100 kev to provide the pair of source/drain regions 28a and 28b of dopant concentration from about $5 \times 10^{18}$ to about $10^{20}$ dopant atoms per cubic centimeter.

As is understood by a person skilled in the art, the anti-fuse structure within the semiconductor integrated circuit microelectronic fabrication whose schematic cross-sectional diagram is illustrated in FIG. 2 comprises: (1) a metal oxide semiconductor field effect transistor (MOSFET) device formed within and upon the first portion of the active region of the semiconductor substrate 10 within the first region R1 of the semiconductor substrate 10, electrically in series with; (2) a metal oxide semiconductor (MOS) capacitor device formed within and upon the second portion of the active region of the semiconductor substrate 10 within the second region R2 of the semiconductor substrate 10. Within the preferred embodiment of the anti-fuse structure as illustrated within FIG. 2, a composite gate dielectric layer within the metal oxide semiconductor field effect transistor (MOSFET) device has a greater thickness than a capacitive dielectric layer within the metal oxide semiconductor (MOS) capacitor device. Similarly, within the preferred embodiment of the anti-fuse structure as illustrated within FIG. 2, the metal oxide semiconductor (MOS) capacitor device employs as a first capacitor plate the doped well 20 which is of polarity equivalent to, and overlapping with, the source/drain region 28b within the metal oxide semiconductor field effect transistor (MOSFET) device.

As is understood by a person skilled in the art, in order to operate the anti-fuse structure of the preferred embodiment of the present invention as illustrated within the schematic cross-sectional diagram of FIG. 2, a comparatively low programming voltage of from about 1 to about 5 volts is applied to the second capacitor plate 24b of the metal oxide semiconductor (MOS) capacitor device and a selection voltage of from about 3 to about 5 volts is applied to the gate electrode 24b of the metal oxide semiconductor field effect transistor (MOSFET) device, while the semiconductor substrate 10. As is understood by a person skilled in the art, the programming voltage, while comparatively low in comparison with anti-fuse structure programming voltages of from about 10 to about 20 volts as are otherwise conventional in the art of anti-fuse structure programming, is sufficiently high to fuse the metal oxide semiconductor (MOS) capacitor anti-fuse device to form a conductive link due to the comparative thinness of the capacitive dielectric layer within the metal oxide semiconductor (MOS) capacitor anti-fuse device, while not electrically over-stressing adjacent microelectronic devices or microelectronic structures (such as in particular the metal oxide semiconductor field effect transistor (MOSFET) device) within the semiconductor integrated circuit microelectronic fabrication whose schematic cross-sectional diagram is illustrated in FIG. 2.

As is further understood by a person skilled in the art, additional microelectronic devices and microelectronic structures may be fabricated in conjunction with the anti-fuse structure whose schematic cross-sectional diagram is illustrated in FIG. 2. In particular, such additional microelectronic devices and microelectronic structures may include at least one additional metal oxide semiconductor field effect transistor (MOSFET) device further electrically in series with the metal oxide semiconductor field effect transistor (MOSFET) device as illustrated within the schematic cross-sectional diagram of FIG. 2, but further removed from the metal oxide semiconductor (MOS) capacitor device, while sharing the source/drain region 28a, such as to further isolate the metal oxide semiconductor (MOS) capacitor anti-fuse device from yet further microelectronic devices and microelectronic structures within the semiconductor integrated circuit microelectronic fabrication whose schematic cross-sectional diagram is illustrated in FIG. 2.

As is understood by a person skilled in the art, the preferred embodiment of the present invention is illustrative of the present invention rather than limiting of the present invention. Revisions and modifications may be made to methods and materials from which is formed an anti-fuse structure in accord with the preferred embodiment of the present invention while still providing an anti-fuse structure and a method for operating the anti-fuse structure in accord with the present invention, further in accord with the accompanying claims.

What is claimed is:

1. An anti-fuse structure comprising:

a semiconductor substrate having a first region adjoining a second region;

a metal oxide semiconductor field effect transistor formed within and upon the first region of the semiconductor substrate and a metal oxide semiconductor capacitor Conned within and upon the second region of the semiconductor substrate wherein:

a gate dielectric layer within the metal oxide semiconductor field effect transistor is thicker than a capacitive dielectric layer within the metal oxide semiconductor capacitor; and the metal oxide semiconductor capacitor is formed employing as a first capacitor plate a doped well within the semiconductor substrate of the same polarity as and overlapping wit a source/drain region within the metal oxide semiconductor field effect transistor.

2. The anti-fuse structure of claim 1 wherein the anti-fuse structure is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The anti-fuse structure of claim 1 wherein the metal oxide semiconductor field effect transistor is a N-metal oxide semiconductor field effect transistor.

4. The anti-fuse structure of claim 1 wherein the metal oxide semiconductor field effect transistor is a P-metal oxide semiconductor field effect transistor.

5. The anti-fuse structure of claim 1 wherein the gate dielectric layer is formed to a thickness of from about 20 to about 200 angstroms.

6. The anti-fuse structure of claim 1 wherein the capacitive dielectric layer is formed to a thickness of from about 5 to about 50 angstroms.

7. The anti-fuse structure of claim 1 wherein a gate electrode within the metal oxide semiconductor field effect transistor and a second capacitor plate within the metal oxide semiconductor capacitor are both formed at least in part of a doped polysilicon material, of either polarity.

\* \* \* \* \*